US008896734B2

(12) United States Patent
Shinohara

(10) Patent No.: US 8,896,734 B2
(45) Date of Patent: Nov. 25, 2014

(54) SOLID-STATE IMAGE SENSOR, METHOD OF MANUFACTURING THE SAME, AND CAMERA

(75) Inventor: Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 85 days.

(21) Appl. No.: 13/307,361

(22) Filed: Nov. 30, 2011

(65) Prior Publication Data

US 2012/0154650 A1    Jun. 21, 2012

(30) Foreign Application Priority Data

Dec. 15, 2010 (JP) ................................. 2010-279873

(51) Int. Cl.
| H01L 29/76 | (2006.01) |
| H01L 29/768 | (2006.01) |
| H01L 29/02 | (2006.01) |
| H04N 3/14 | (2006.01) |
| H04N 5/335 | (2011.01) |
| H01L 27/146 | (2006.01) |

(52) U.S. Cl.
CPC ....... H01L 27/14689 (2013.01); *H01L 27/1461* (2013.01); H01L 27/14607 (2013.01)
USPC ............ 348/294; 257/213; 257/221; 257/224

(58) Field of Classification Search
USPC .................................. 348/294; 257/213–413
See application file for complete search history.

(56) References Cited

U.S. PATENT DOCUMENTS

| 4,962,412 A | 10/1990 | Shinohara et al. |
| 5,008,206 A | 4/1991 | Shinohara et al. |
| 5,086,326 A | 2/1992 | Shinohara et al. |
| 6,483,132 B2 | 11/2002 | Kawakami |
| 6,690,423 B1 * | 2/2004 | Nakamura et al. ............ 348/311 |
| 6,828,601 B2 | 12/2004 | Shinohara |
| 7,141,836 B1 | 11/2006 | Adkisson et al. |

(Continued)

FOREIGN PATENT DOCUMENTS

| CN | 1873993 A | 12/2006 |
| CN | 101202246 A | 6/2008 |

(Continued)

OTHER PUBLICATIONS

European Patent Office, Communication in connection with Application No. 11191669.8, dated Apr. 5, 2012 (10 pages).

(Continued)

*Primary Examiner* — Timothy J Henn
*Assistant Examiner* — Pritham Prabhakher
(74) *Attorney, Agent, or Firm* — Fitzpatrick, Cella, Harper & Scinto

(57) ABSTRACT

A solid-state image sensor includes a first semiconductor region of a first conductivity type, a second semiconductor region of a second conductivity type that is arranged to contact a lower face of the first semiconductor region and functions as a charge accumulation region, a third semiconductor region including side faces surrounded by the second semiconductor region, a fourth semiconductor region of the second conductivity type that is arranged apart from the second semiconductor region, and a transfer gate that forms a channel to transfer charges accumulated in the second semiconductor region to the fourth semiconductor region. The third semiconductor region is one of a semiconductor region of the first conductivity type and a semiconductor region of the second conductivity type whose impurity concentration is lower than that in the second semiconductor region.

13 Claims, 6 Drawing Sheets

(56) References Cited

U.S. PATENT DOCUMENTS

| | | |
|---|---|---|
| 7,250,970 B2 | 7/2007 | Shinohara |
| 7,334,211 B1 | 2/2008 | Toros et al. |
| 7,394,492 B2 | 7/2008 | Shinohara |
| 7,491,561 B2 | 2/2009 | Adkisson et al. |
| 7,989,252 B2 | 8/2011 | Yang et al. |
| 2002/0047115 A1 | 4/2002 | Kawakami et al. |
| 2004/0173799 A1* | 9/2004 | Patrick .................. 257/72 |
| 2004/0188727 A1* | 9/2004 | Patrick .................. 257/292 |
| 2006/0267013 A1 | 11/2006 | Adkisson et al. |
| 2007/0087463 A1 | 4/2007 | Adkisson et al. |
| 2007/0152292 A1* | 7/2007 | Toros et al. .............. 257/463 |
| 2008/0142856 A1 | 6/2008 | Sato et al. |
| 2008/0145963 A1 | 6/2008 | Yang et al. |
| 2009/0086066 A1 | 4/2009 | Itonaga |
| 2010/0002108 A1* | 1/2010 | Mabuchi .................. 348/294 |
| 2010/0149397 A1 | 6/2010 | Mutoh |
| 2010/0225793 A1* | 9/2010 | Matsuda et al. ........... 348/280 |
| 2010/0243864 A1 | 9/2010 | Itonaga |
| 2011/0019052 A1 | 1/2011 | Iida et al. |

FOREIGN PATENT DOCUMENTS

| | | |
|---|---|---|
| CN | 101853867 A | 10/2010 |
| EP | 0 944 117 A1 | 9/1999 |
| JP | 2001291859 | 10/2001 |
| JP | 2008-078302 A | 4/2008 |
| JP | 2008-288326 A | 11/2008 |
| JP | 2010-016114 A | 1/2010 |
| JP | 2010-114274 A | 5/2010 |

OTHER PUBLICATIONS

Chinese Office Action in Chinese Patent Appln. No. 201110410224.6 issued Dec. 23, 2013.

* cited by examiner

PIX

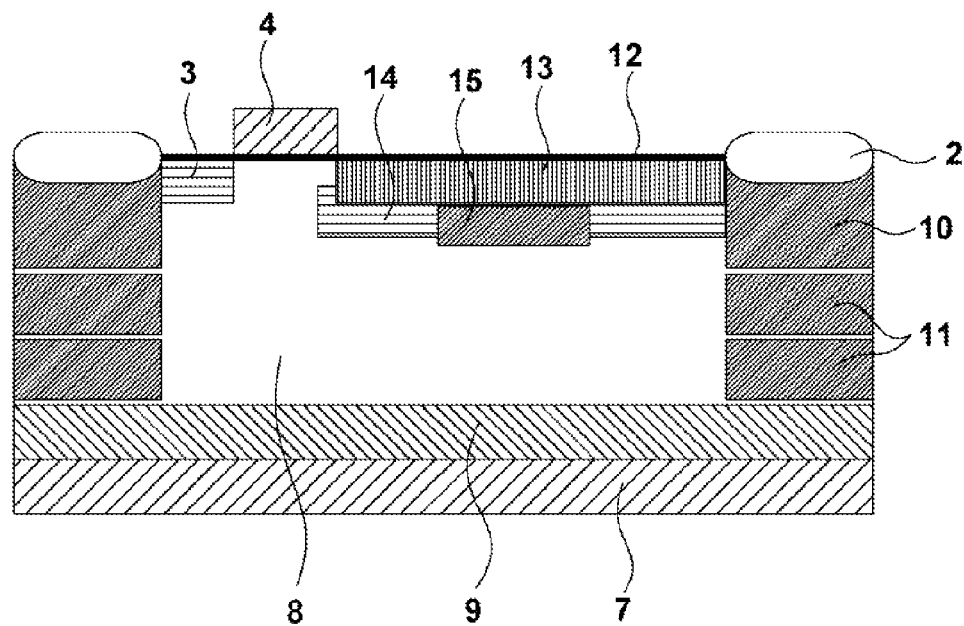
FIG. 2           PIX
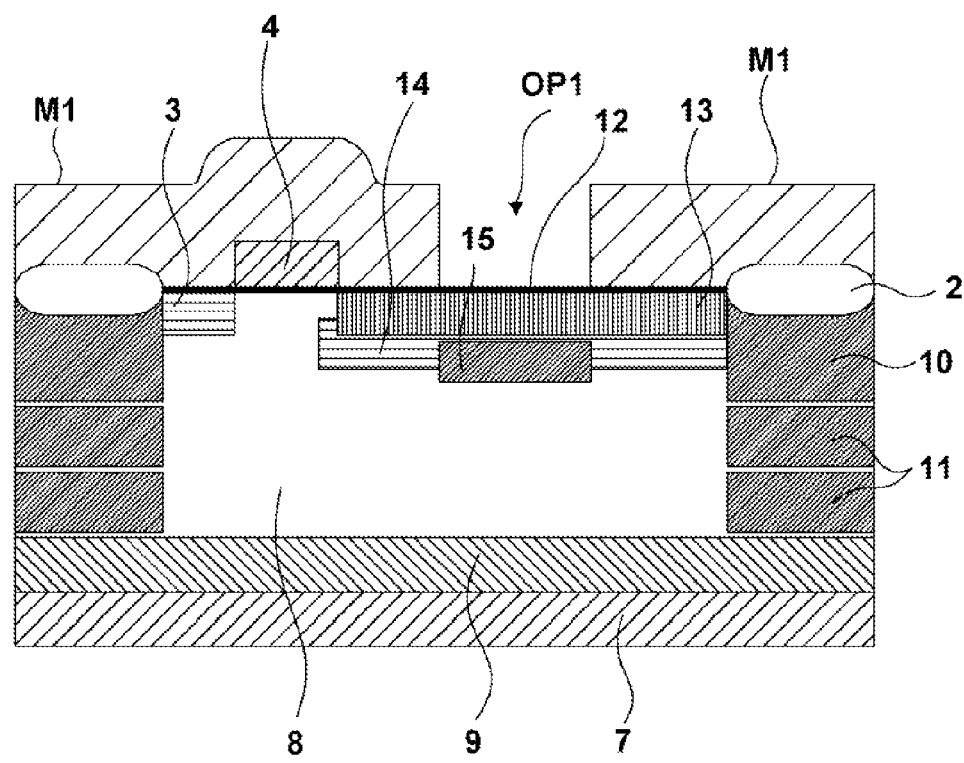
FIG. 3           PIX

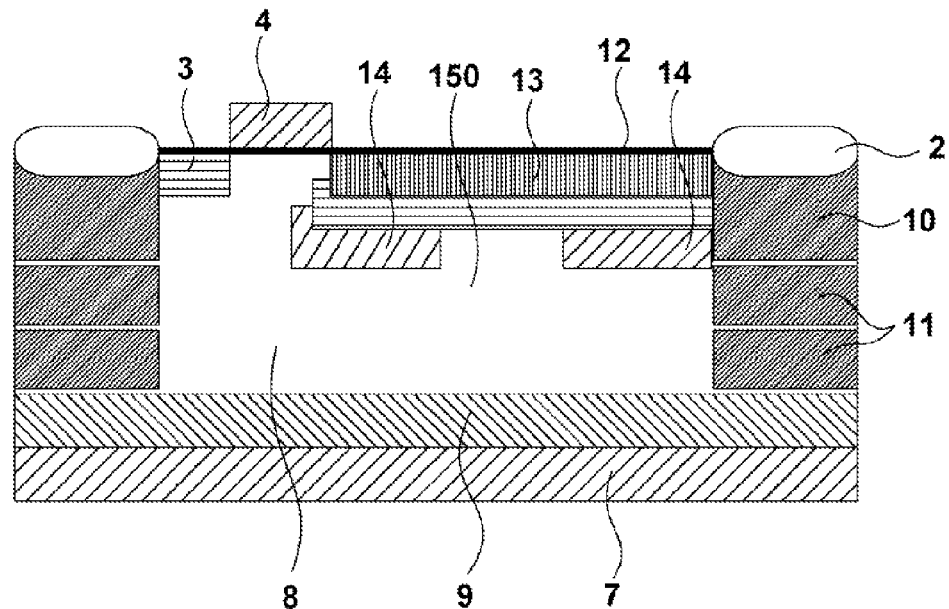
F I G. 5
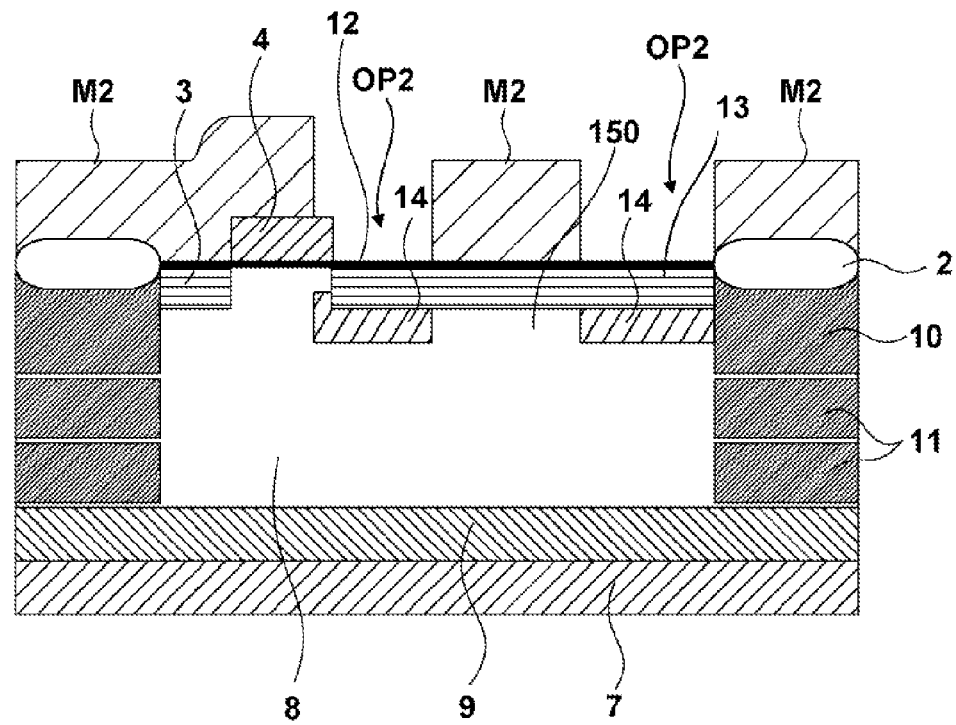
F I G. 6

PIX

SOLID-STATE IMAGE SENSOR, METHOD OF MANUFACTURING THE SAME, AND CAMERA

BACKGROUND OF THE INVENTION

1. Field of the Invention

The present invention relates to a solid-state image sensor, a method of manufacturing the same, and a camera.

2. Description of the Related Art

A solid-state image sensor, such as a CCD sensor or a CMOS sensor, includes a plurality of pixels arranged in the imaging region. Each pixel includes a photoelectric converter and a transfer gate that forms a channel to transfer charges accumulated in the photoelectric converter to the signal output portion. The signal output portion can be a vertical CCD register in the CCD sensor or a floating diffusion connected to the gate of an amplification transistor in the CMOS sensor. For effective signal charge collection and dark current suppression, the photoelectric converter generally uses a buried photo diode, which includes a $p^+$-type region in the surface of the semiconductor, an n-type region just under the $p^+$-type region, and an $n^-$-type region under the n region. The $n^-$-type region that contacts the lower face of the $p^+$-type region serves as a signal charge accumulation region.

The number of saturated electrons, that is, the saturated charge in the accumulation region is almost proportional to the product of the area of the accumulation region and the potential depth. However, as the potential deepens, electron transfer to the signal output portion becomes harder. Especially when the pixel area is small, it is difficult to ensure both a sufficient number of saturated electrons and adequate signal transfer performance.

Japanese Patent Laid-Open No. 2008-078302 discloses a structure in which a $p^+$-type region, an n-type region, a $p^-$-type region, and an $n^-$-type region are arranged in the depth direction from the surface of the semiconductor substrate. In this structure, since the $p^-$-type region is arranged in contact with the lower face of the n-type region serving as the accumulation region, the thickness of the n-type region is limited. Semiconductor theory states that the thinner n-type accumulation region could get the lower voltage necessary for depleting the n-type region, on the condition that the impurity concentration in the n-type accumulation region is adjusted to keep constant the saturation electrons. As the low depletion voltage makes it easy to transfer the signal charge, the limitation of the n-type region thickness could ensure both adequate saturation and the transfer performance.

However, in the structure disclosed in Japanese Patent Laid-Open No. 2008-078302, the potential gradient in the depleted $n^-$-type region collecting the signal charge is small. This may decrease the sensitivity or increase crosstalk. In a structure in which a p-type region is arranged to isolate the pixels in the horizontal direction, especially when the pixel size is small, the p-type region acts to flatten the potential of the $n^-$-type layer. Hence, the sensitivity decrease may be more conspicuous. That is, in the conventional pixel structure or the structure of Japanese Patent Laid-Open No. 2008-078302, it may be difficult to satisfy all the requirements of the saturated charge quantity, transfer performance, and sensitivity especially when the pixel size is small.

SUMMARY OF THE INVENTION

The present invention provides a technique advantageous for satisfying the requirements of the saturated charge quantity, transfer performance, and sensitivity.

The first aspect of the present invention provides a solid-state image sensor comprising: a first semiconductor region of a first conductivity type; a second semiconductor region of a second conductivity type that is arranged to contact a lower face of the first semiconductor region and functions as a charge accumulation region; a third semiconductor region including side faces surrounded by the second semiconductor region; a fourth semiconductor region of the second conductivity type that is arranged apart from the second semiconductor region; and a transfer gate that forms a channel to transfer charges accumulated in the second semiconductor region to the fourth semiconductor region, wherein the third semiconductor region is one of a semiconductor region of the first conductivity type and a semiconductor region of the second conductivity type whose impurity concentration is lower than that in the second semiconductor region.

The second aspect of the present invention provides a method of manufacturing a solid-state image sensor including a substrate in which are arranged a first semiconductor region of a first conductivity type, a second semiconductor region of a second conductivity type that is arranged to contact a lower face of the first semiconductor region and functions as a charge accumulation region, and a fourth semiconductor region of the second conductivity type that is arranged apart from the second semiconductor region, and a transfer gate that forms a channel to transfer charges accumulated in the second semiconductor region to the fourth semiconductor region, the method comprising: implanting ions of the first conductivity type into the substrate to form a third semiconductor region including side faces surrounded by the second semiconductor region.

The third aspect of the present invention provides a method of manufacturing a solid-state image sensor including a first semiconductor region of a first conductivity type, a second semiconductor region of a second conductivity type that is arranged to contact a lower face of the first semiconductor region and functions as a charge accumulation region, a fourth semiconductor region of the second conductivity type that is arranged apart from the second semiconductor region, and a transfer gate that forms a channel to transfer charges accumulated in the second semiconductor region to the fourth semiconductor region, the method comprising: implanting ions into a region where the second semiconductor region should be formed to form the second semiconductor region and define a third semiconductor region of the second conductivity type including side faces surrounded by the second semiconductor region, wherein the third semiconductor region is a semiconductor region whose impurity concentration of the second conductivity type is lower than that in the second semiconductor region.

The fourth aspect of the present invention provides a camera comprising: a solid-state image sensor as defined in the first aspect of the present invention; and a processing unit that processes a signal output from the solid-state image sensor.

Further features of the present invention will become apparent from the following description of exemplary embodiments with reference to the attached drawings.

BRIEF DESCRIPTION OF THE DRAWINGS

FIG. 2 is a sectional view showing the structure of one pixel of the solid-state image sensor according to the first embodiment of the present invention;

FIG. 3 is a sectional view for explaining a method of manufacturing the solid-state image sensor according to the first embodiment of the present invention;

FIG. 5 is a sectional view showing the structure of one pixel of the solid-state image sensor according to the second embodiment of the present invention;

FIG. 6 is a sectional view for explaining a method of manufacturing the solid-state image sensor according to the second embodiment of the present invention;

DESCRIPTION OF THE EMBODIMENTS

A solid-state image sensor of the present invention is applicable to various sensors, such as a CMOS sensor and a CCD sensor, which have a function of transferring charges accumulated in the charge accumulation region to the signal output portion such as a floating diffusion or a vertical CCD register. The solid-state image sensor includes a plurality of pixels. Each pixel can include a photoelectric converter including a charge accumulation region, and a transfer gate that forms a channel to transfer charges (electrons or holes) accumulated in the charge accumulation region. In the CMOS sensor, a floating diffusion portion serving as the signal output portion can be shared by a plurality of pixels or a plurality of photoelectric converters.

"First conductivity type" and "second conductivity type" used in the claims are terms that express conductivity types that are different from each other. When the "first conductivity type" is a p type, the "second conductivity type" is an n type. The following example assumes for simplicity the conductivity type is defined as indicated above, but the present invention is also effective in a device of the reverse conductivity. The n-type charge accumulation region stores electrons out of electron and hole carriers generating in the photoelectric conversion region, while the p-type charge accumulation region stores holes as signal carriers. The present invention is applicable to various sensors having the function of transferring charges accumulated in the charge accumulation region to the signal output portion, as described above. The following example, however, assumes only a CMOS sensor for simplicity.

Figure 1:
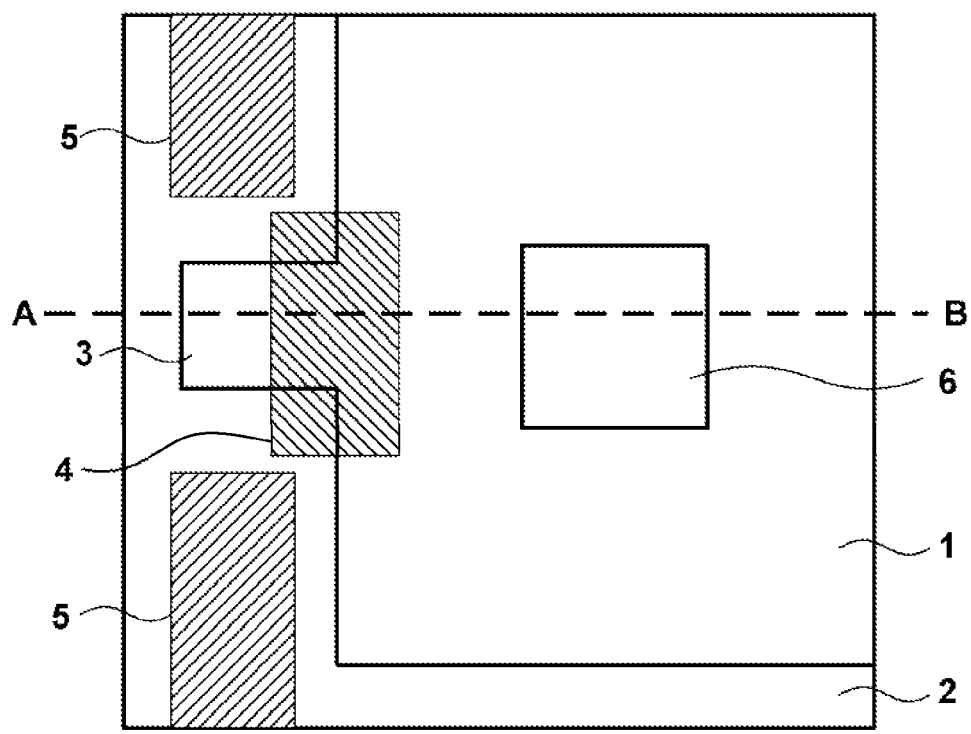
FIG. 1 is a plan view showing the structure of one pixel of a solid-state image sensor according to the first, second, and fourth embodiments of the present invention.

FIG. 1 is a plan view showing the structure of one pixel PIX of a CMOS sensor according to the first embodiment of the present invention. The pixel PIX can include a photodiode (to be referred to as a PD hereinafter) 1, a floating diffusion portion (to be referred to as an FD hereinafter) 3 serving as a signal output portion, and a transfer gate 4. The PD 1 includes a charge accumulator, which accumulates the signal charge generated by incident light. The FD 3 changes its potential in accordance with the quantity of charges transferred to the FD. That is, the FD 3 functions as a charge-to-voltage converter that converts a signal in a charge form into a signal in a voltage form. Note that the FD 3 may be connected to another FD or shared by another PD. The transfer gate 4 forms a channel to transfer the charges accumulated in the charge accumulator of the PD 1 to the FD 3. Regarding the PD 1 as a source or drain and the FD 3 as a drain or source, a MOS transistor is thought to be formed of the PD 1, the FD 3, and the transfer gate 4. The PD 1 and the FD 3 are isolated from other elements (other elements in the pixel and the elements of other pixels) by an element isolator 2, which can be made of either an insulator or a p-n junction. The pixel PIX can include a region 5 where another element, such as an amplification MOS transistor that outputs a signal corresponding to the potential of the FD 3 to a vertical signal line or a reset MOS transistor that resets the potential of the FD 3, is arranged.

FIG. 2 is a schematic sectional view taken along a line A-B in FIG. 1. The pixel PIX includes a first semiconductor region ($p^+$-type region in this case) 13 of the first conductivity type, and a second semiconductor region (n-type region; signal-electron accumulation region in this case) 14 of the second conductivity type arranged in contact with the lower face of the first semiconductor region 13 and functioning as the charge accumulator. As a characteristic structure, the pixel PIX also includes a third semiconductor region 15 (p-type region) of the first conductivity type including side faces surrounded by the second semiconductor region 14. The pixel PIX also includes the FD 3 that is the fourth semiconductor region of the second conductivity type arranged apart from the second semiconductor region 14, and the transfer gate 4 that forms a channel in a fifth semiconductor region 8 ($n^-$-type region) of the second conductivity type to transfer the charges accumulated in the second semiconductor region 14 to the FD 3. The transfer gate 4 is arranged on an insulating film 12 on the fifth semiconductor region 8. The fifth semiconductor region 8 can include a portion that contacts the lower face of the second semiconductor region 14 and the lower face of the third semiconductor region 15, a portion that contacts the FD 3, and a portion where the channel is formed by the potential applied to the transfer gate 4. The PD 1 and the FD 3 are isolated from other elements (other elements in the pixel and the elements of other pixels) by the element isolator 2. The pixel PIX also includes a sixth semiconductor region 9 of the first conductivity type that contacts the lower face of the fifth semiconductor region 8. The PD 1 is a buried structure formed of the first semiconductor region 13, the second semiconductor region 14, the third semiconductor region 15, the fifth semiconductor region 8, and the sixth semiconductor region 9. The sixth semiconductor region 9 of the first conductivity type defines the depth of the PD 1 and is overlayed on a semiconductor region 7 (for example, semiconductor substrate) of the second conductivity type. A semiconductor region 10 of the first conductivity type that forms a channel stop can be formed under the element isolator 2. A semiconductor region 11 of the first conductivity type that isolates the pixels from each other can be formed between the sixth semiconductor region 9 and the semiconductor region 10 and is capable of forming the channel stop. The semiconductor region 11 is formed from, for example, a plurality of semiconductor regions in the depth direction. The semiconductor region 11 can have, for example, a plurality of impurity concentration peaks.

The third semiconductor region 15 of the first conductivity type can be formed not to contact the sixth semiconductor region 9 of the first conductivity type. In other words, the lower face of the third semiconductor region 15 is arranged at a position shallower than the upper face of the sixth semiconductor region 9 of the first conductivity type. Preferably, the lower face of the third semiconductor region 15 is arranged at a position shallower than the uppermost end of the semiconductor region 11 not to decrease the potential gradient at the semiconductor region 14 as a photoelectric conversion region. The third semiconductor region 15 can be arranged not to contact the first semiconductor region 13 of the first conductivity type. In other words, the third semiconductor region 15 can include the upper face that contacts the second semiconductor region 14 of the second conductivity type.

The fifth semiconductor region 8, which spreads from the second semiconductor region 14 of the second conductivity type, surrounding at least the upper portions of the side faces of the third semiconductor region 15 of the first conductivity type up to the sixth semiconductor region 9, serves as a photoelectric conversion region where incident light generates electron and hole carriers. Because the potential gradient in this region almost equals that in the arrangement without the third semiconductor region 15, the structure with the high quantum efficiency keeps both low crosstalk and high sensitivity.

FIG. 3 is a sectional view for explaining an ion implantation step of forming a third semiconductor region 15. The method of manufacturing the solid-state image sensor of the first embodiment can include a mask formation step and an ion implantation step. In the mask formation step, a mask M1 having an opening OP1 corresponding to the third semiconductor region 15 is formed. In the ion implantation step, ions to form the first conductivity type regions are implanted into the substrate using the mask M1. In this step, formation of the semiconductor region 13 or the second semiconductor region 14, which are in FIG. 3 to show explicitly the geometric relation to the third semiconductor region 15, is not necessarily to have finished. They might be formed after the formation of the semiconductor region 15. The third semiconductor region 15 and the semiconductor region 10 of the first conductivity type may be formed in a single step. The third semiconductor region 15 is assumed here to be of the first conductivity type (p-type region). However, it may be of the second conductivity type (n-type region) having an impurity concentration lower than that of the second semiconductor region 14. In this case, ion implantation is performed using a dose lower than that for the first conductivity type. The method of manufacturing the solid-state image sensor of the first embodiment can also include a step of implanting ions into the substrate to further form the semiconductor region 11 of the first conductivity type under the semiconductor region 10 of the first conductivity type.

Figure 4A:
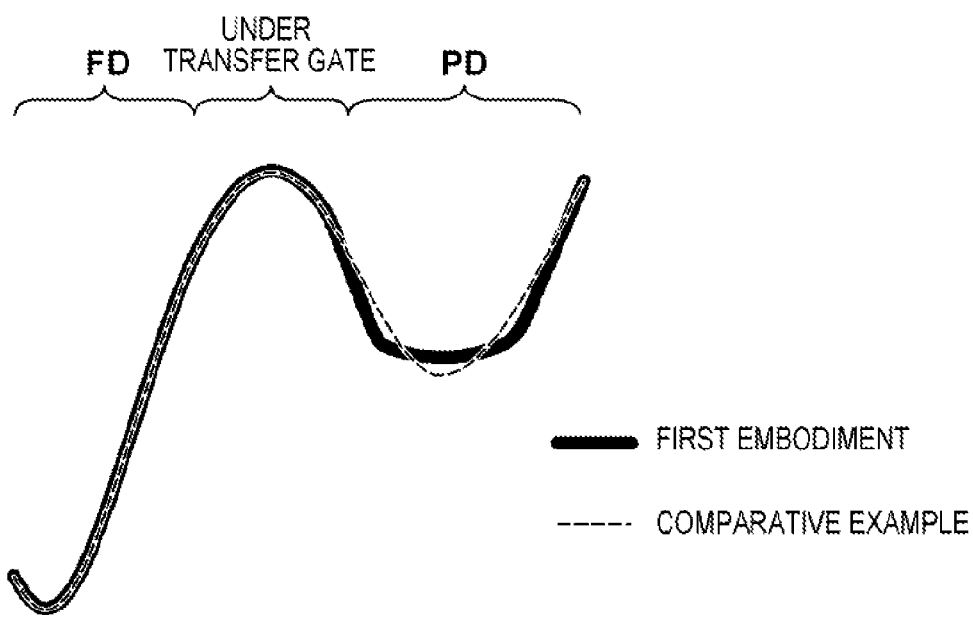
FIGS. 4A and 4B are graphs showing potential distributions.
Figure 4B:
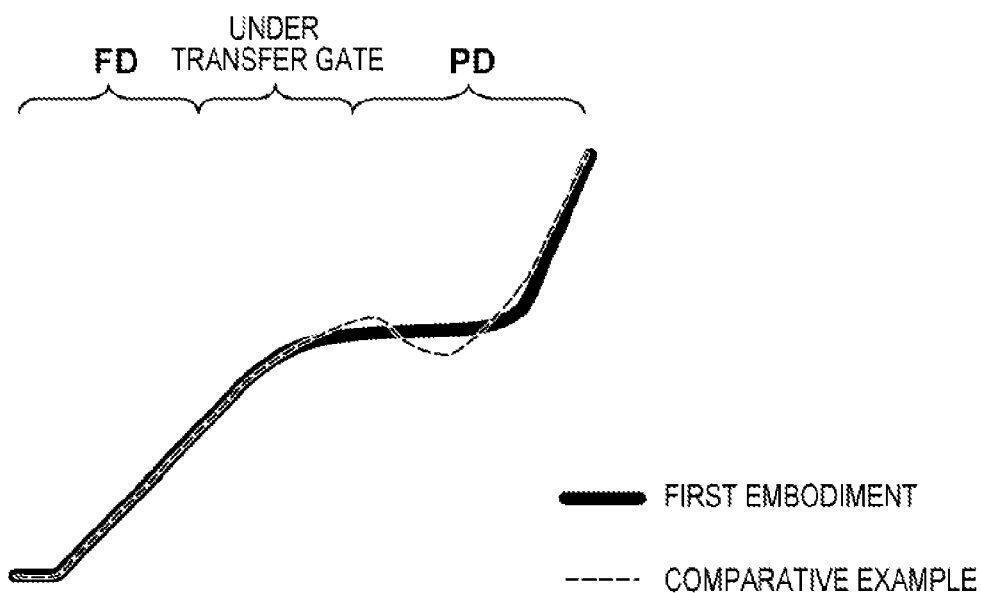

FIG. 4A is a graph showing the potential distribution along the line A-B in FIG. 1 when no channel is formed by the transfer gate 4 (when the transfer MOS transistor including the transfer gate 4 is off). In this state, electrons are accumulated in the second semiconductor region 14 serving as the charge accumulation region. FIG. 4B is a graph showing the potential distribution along the line A-B in FIG. 1 when the channel is formed by the transfer gate 4 (when the transfer MOS transistor including the transfer gate 4 is on). In this state, electrons accumulated in the second semiconductor region 14 serving as the charge accumulation region are transferred to the FD 3 through the channel. Referring to FIGS. 4A and 4B, a bold line indicates the potential distribution in the pixel of the first embodiment, and a thin line indicates the potential distribution of a comparative example, in which the third semiconductor region 15 is removed from the structure shown in FIG. 2 and the impurity concentration of the second semiconductor region 14 is adjusted so that the saturated charge in the second semiconductor region 14 is the same as that of the first embodiment.

As shown in FIG. 4A, the bottom portion of the potential distribution of the first embodiment spreads in the horizontal direction more than in the comparative example. Hence, the bottom portion of the potential distribution is closer to the transfer gate 4 in the first embodiment than in the comparative example. This is because the structure includes the third semiconductor region 15 of the first conductivity type including the side faces surrounded by the second semiconductor region 14 of the second conductivity type. The first embodiment is freer from the potential barrier in the path from the PD 1 to the FD 3 than the comparative example. Hence, the first embodiment, keeping the saturation signals, could improve the performance of charge transfer to the FD 3 as compared to the comparative example. On the other hand, the bottom portion of the potential distribution is higher in the first embodiment than in the comparative example. However, since the bottom portion of the potential distribution of the first embodiment spreads in the horizontal direction, as described above, the decrease in the saturated charge quantity is suppressed. Note that the saturated charge quantity can be increased by raising the impurity concentration of the second conductivity type in the second semiconductor region 14.

Hence, the pixel structure of the first embodiment is advantageous for obtaining a sufficient sensitivity, transfer performance, and saturated charge quantity, especially when the pixel size is small.

The structure of one pixel PIX of a CMOS sensor according to the second embodiment of the present invention will be described with reference to FIG. 5. Note that points that are not mentioned here can comply with the first embodiment. The pixel PIX of the second embodiment includes a third semiconductor region (n⁻-type region) 150 of the second conductivity type in place of the third semiconductor region 15 of the first conductivity type of the first embodiment. The impurity concentration of the second conductivity type in the third semiconductor region (n⁻-type region) 150 is lower than that in a second semiconductor region (n-type region) 14. The impurity concentration of the second conductivity type in the third semiconductor region (n⁻-type region) 150 can be equal to that in a fifth semiconductor region (n⁻-type region) 8. The second semiconductor region 14 can have a frame shape or a ring shape.

FIG. 6 is a sectional view for explaining an ion implantation step of implanting ions into the substrate to form a second semiconductor region 14 so as to define a third semiconductor region 150. The method of manufacturing the solid-state image sensor of the second embodiment includes a step of forming a mask M2 having an opening OP2 on a region corresponding to the region where the second semiconductor region 14 should be formed, and an ion implantation step of implanting ions into the substrate using the mask M2. The mask M2 is formed to cover a portion corresponding to the region where the third semiconductor region 150 should be formed. In the ion implantation step, ions are implanted into the region where the second semiconductor region 14 should be formed in the substrate using the mask M2 so as to define the third semiconductor region 150 of the second conductivity type including side faces surrounded by the second semiconductor region 14 of the second conductivity type. FIG. 6 shows the geometric relation of the semiconductor regions. The first semiconductor region 13 may be formed after the formation of the semiconductor region 14.

According to the pixel structure of the second embodiment, it is possible to form the same potential distribution as that formed by the pixel structure of the first embodiment. In addition, the pixel structure is simpler because of the absence of the third semiconductor region 15 of the first conductivity type.

The second embodiment is also advantageous for obtaining a sufficient sensitivity, transfer performance, and saturated charge quantity.

Figure 7:
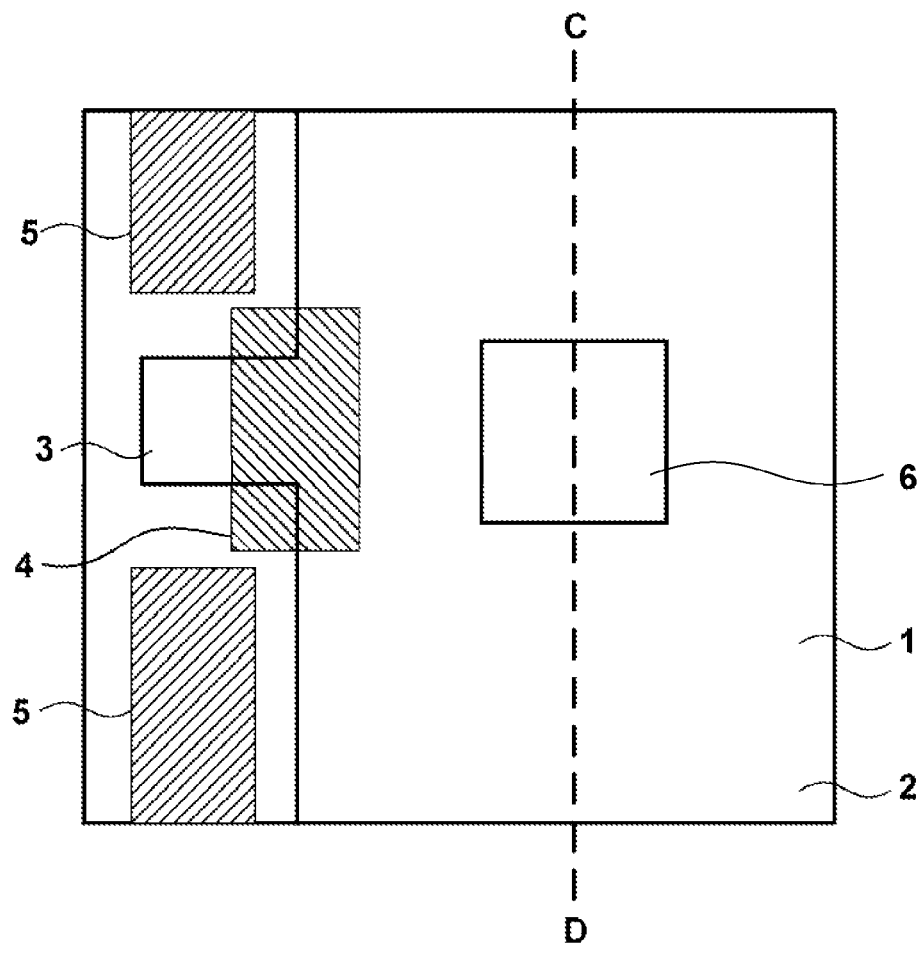
FIG. 7 is a plan view showing the structure of one pixel of a solid-state image sensor according to the third embodiment of the present invention.
Figure 8:
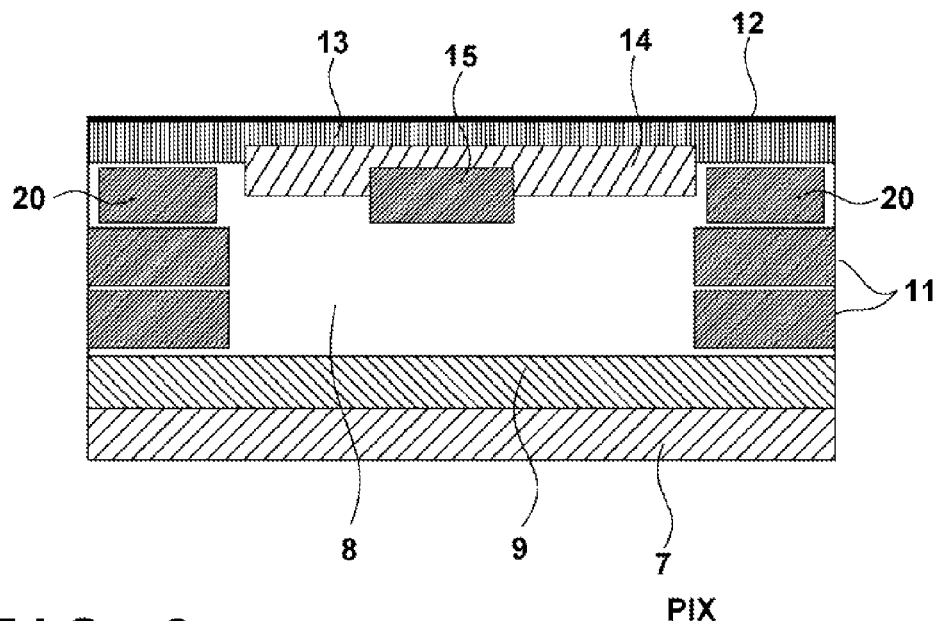
FIG. 8 is a sectional view showing the structure of one pixel of the solid-state image sensor according to the third embodiment of the present invention.

The third embodiment of the present invention will be described with reference to FIGS. 7 and 8. FIG. 7 is a plan view showing the structure of one pixel PIX of a CMOS sensor according to the third embodiment of the present invention. FIG. 8 is a schematic sectional view taken along a line C-D in FIG. 7. Note that points that are not mentioned here can comply with the first embodiment. In the third embodiment, each pixel includes a second semiconductor region 14, a third semiconductor region 15, and a transfer gate 4. A semiconductor region 20 of the first conductivity type is arranged between the second semiconductor region 14 of one pixel and that of another pixel. No element isolator made of an insulator is arranged on the semiconductor region 20. When an element isolator (for example, LOCOS or STI) made of an insulator (oxide film) is used to isolate PDs from each other, the break of the periodical atomic structure on the interface between the semiconductor and the insulator may cause a dark current that leads to image quality degradation. In the third embodiment, the semiconductor region 20 (impurity semiconductor region) is used to isolate the PDs of adjacent pixels from each other. The third semiconductor region 15 for potential distribution control and the semiconductor region 20 for isolation may be formed in a single step. In this case, the process can be simplified. This simplified process can be performed when the third semiconductor region 15 and the semiconductor region 20 are arranged at the same depth and have the same impurity concentration. Note that the step of forming the third semiconductor region 15 can be performed either before or after the step of forming the first semiconductor region 13 and the second semiconductor region 14.

The third embodiment is advantageous for obtaining a sufficient sensitivity, transfer performance, and saturated charge quantity and is also advantageous for reducing the dark current.

Figure 9:
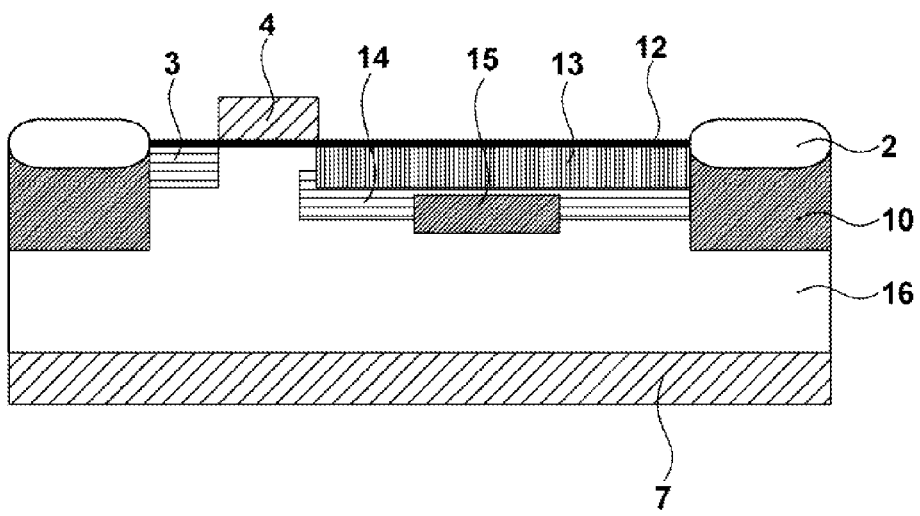
FIG. 9 is a sectional view showing the structure of one pixel of the solid-state image sensor according to the fourth embodiment of the present invention.

FIG. 9 is a schematic sectional view taken along the line A-B in FIG. 1 so as to illustrate the structure of one pixel PIX of a CMOS sensor according to the fourth embodiment of the present invention. Points that are not mentioned here can comply with the first embodiment. The pixel PIX of the fourth embodiment further includes a semiconductor region (p-type well) 16 of the first conductivity type including a portion that contacts the lower face of a second semiconductor region 14 and the lower face of a third semiconductor region 15. The semiconductor region 16 can include a portion that contacts an FD 3 and a portion where the channel is formed by the potential applied to a transfer gate 4. In the fourth embodiment, since the potential gradient can be smaller, high transfer performance can be obtained, but the sensitivity can be lower. The pixel structure of the fourth embodiment is also advantageous for both the transfer efficiency and the saturated charge quantity because of the presence of the third semiconductor region 15. This also applies even when a semiconductor region 150 of the second conductivity type is adopted in place of the semiconductor region 15 of the first conductivity type, as in the second embodiment.

In the first to fourth embodiments, the impurity concentration of the first conductivity type is lower in the third semiconductor region 15 or the semiconductor region 150 than in the first semiconductor region 13 of the first conductivity type.

The third semiconductor region 15 may exist in the second semiconductor region 14, or a plurality of third semiconductor regions 15 may exist. For example, in the third embodiment, the third semiconductor region 15 formed at the same time as the semiconductor region 11 may be provided in addition to the semiconductor region 20.

In the first, second, and third embodiments, the lightly-doped fifth semiconductor region 8 of the second conductivity type can be depleted to form the main photoelectric conversion region. However, the fifth semiconductor region 8 of the second conductivity type may be replaced with a heavily-doped semiconductor region of the first conductivity type. The arrangements of the embodiments can be combined as needed.

As an application example of the solid-state image sensor according to the above-described embodiments, a camera incorporating the solid-state image sensor will be exemplified. The concept of a camera includes not only an apparatus mainly aiming at shooting but also an apparatus (for example, personal computer or cellular phone) secondarily having the shooting function. The camera includes the solid-state image sensor of the present invention described in the above embodiments, and a processing unit that processes a signal output from the solid-state image sensor. The processing unit can include, for example, an A/D converter and a processor that processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-279873, filed Dec. 15, 2010, which is hereby incorporated by reference herein in its entirety.

The invention claimed is:

1. A solid-state image sensor comprising:
   a first semiconductor region of a first conductivity type;
   a second semiconductor region of a second conductivity type that is arranged to contact a lower face of the first semiconductor region and functions as a charge accumulation region;
   a third semiconductor region including an upper face contacting the second semiconductor region, a lower face, and a side face surrounded by the second semiconductor region, the third semiconductor region not contacting the first semiconductor region;
   a fourth semiconductor region of the second conductivity type that is arranged apart from the second semiconductor region;
   a fifth semiconductor region of the second conductivity type that is arranged to contact the lower face of the third semiconductor region and a lower face of the second semiconductor region; and
   a transfer gate that forms a channel to transfer charges accumulated in the second semiconductor region to the fourth semiconductor region,
   wherein a portion extending from the upper face of the third semiconductor region to the lower face of the third semiconductor region consists of (a) a semiconductor region of the first conductivity type, or (b) a semiconductor region of the second conductivity type whose impurity concentration is lower than that in the second semiconductor region.

2. The sensor according to claim 1, further comprising a sixth semiconductor region of the first conductivity type that contacts a lower face of the fifth semiconductor region.

3. The sensor according to claim 1, further comprising a semiconductor region of the first conductivity type including a portion that contacts a lower face of the second semiconductor region and a lower face of the third semiconductor region.

4. The sensor according to claim 1, configured to comprise a plurality of pixels,
wherein each pixel includes the second semiconductor region, the third semiconductor region, and the transfer gate, and a semiconductor region of the first conductivity type is arranged between the second semiconductor region of one pixel and the second semiconductor region of another pixel.

5. The sensor according to claim 1, configured to comprise a plurality of pixels,
wherein each pixel includes the second semiconductor region, the third semiconductor region, and the transfer gate, and a semiconductor region of the first conductivity type is arranged between the second semiconductor region of one pixel and the second semiconductor region of another pixel, and
the third semiconductor region and the semiconductor region are arranged at the same depth and have the same impurity concentration.

6. The sensor according to claim 1, wherein a semiconductor region of the second conductivity type is not arranged between the second semiconductor region and the third semiconductor region.

7. A method of manufacturing a solid-state image sensor including a substrate in which are arranged a first semiconductor region of a first conductivity type, a second semiconductor region of a second conductivity type that is arranged to contact a lower face of the first semiconductor region and functions as a charge accumulation region, a fourth semiconductor region of the second conductivity type that is arranged apart from the second semiconductor region, a fifth semiconductor region of the second conductivity type, and a transfer gate that forms a channel to transfer charges accumulated in the second semiconductor region to the fourth semiconductor region, the method comprising:
implanting ions of the first conductivity type into a region of the substrate, such that the region is changed to a third semiconductor region including a side face surrounded by the second semiconductor region, an upper face contacting the second semiconductor region, and a lower face contacting the fifth semiconductor region, the third semiconductor region not contacting the first semiconductor region,
wherein a portion extending from the upper face of the third semiconductor region to the lower face of the third semiconductor region has the first conductivity type.

8. The method according to claim 7, wherein
the solid-state image sensor includes a plurality of pixels each of which includes the second semiconductor region, the third semiconductor region, and the transfer gate, and
in the step of implanting the ions, the ions are implanted into the substrate to form a semiconductor region of the first conductivity type between the second semiconductor region of one pixel and the second semiconductor region of another pixel together with the third semiconductor region.

9. The method according to claim 8, wherein in the step of implanting the ions, the ions are implanted into the substrate such that the third semiconductor region and the semiconductor region of the first conductivity type are arranged at the same depth and have the same impurity concentration.

10. The method according to claim 8, further comprising the step of implanting ions into the substrate to form another semiconductor region of the first conductivity type under the semiconductor region of the first conductivity type.

11. The method according to claim 7, further comprising the step of forming the first semiconductor region and the second semiconductor region after the implanting the ions to form the third semiconductor region.

12. A camera comprising:
the solid-state image sensor of claim 1; and
a processing unit that processes a signal output from the solid-state image sensor.

13. A method of manufacturing a solid-state image sensor including a substrate in which are arranged a first semiconductor region of a first conductivity type, a second semiconductor region of a second conductivity type that is arranged to contact a lower face of the first semiconductor region and functions as a charge accumulation region, a fourth semiconductor region of the second conductivity type that is arranged apart from the second semiconductor region, a fifth semiconductor region of the second conductivity type, and a transfer gate that forms a channel to transfer charges accumulated in the second semiconductor region to the fourth semiconductor region, the method comprising:
implanting ions of the first conductivity type into a region of the substrate, such that the region is changed to a third semiconductor region including a side face and an upper face contacting the second semiconductor region, and a lower face contacting the fifth semiconductor region, the third semiconductor region not contacting the first semiconductor region,
wherein a portion extending from the upper face of the third semiconductor region to the lower face of the third semiconductor region has the second conductivity type, and has an impurity concentration lower than that of the second semiconductor region.

* * * * *